(12) United States Patent
Wang et al.

(10) Patent No.: US 11,004,774 B2
(45) Date of Patent: May 11, 2021

(54) FABRICATING FIELD-EFFECT TRANSISTORS WITH BODY CONTACTS BETWEEN SOURCE, GATE AND DRAIN ASSEMBLIES

(71) Applicant: SKYWORKS SOLUTIONS, INC., Woburn, MA (US)

(72) Inventors: Hailing Wang, Acton, MA (US); Dylan Charles Bartle, Arlington, MA (US); Hanching Fuh, Allston, MA (US); David Scott Whitefield, Andover, MA (US); Paul T. DiCarlo, Marlborough, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 16/566,837

(22) Filed: Sep. 10, 2019

(65) Prior Publication Data

US 2020/0075462 A1   Mar. 5, 2020

Related U.S. Application Data

(63) Continuation of application No. 15/475,510, filed on Mar. 31, 2017, now Pat. No. 10,410,957.

(Continued)

(51) Int. Cl.
| | |
|---|---|
| *H01L 27/12* | (2006.01) |
| *H01L 23/482* | (2006.01) |
| *H01L 23/66* | (2006.01) |
| *H01L 27/02* | (2006.01) |
| *H01L 29/10* | (2006.01) |
| *H01L 21/74* | (2006.01) |
| *H01L 29/786* | (2006.01) |
| *H01L 29/417* | (2006.01) |

(Continued)

(52) U.S. Cl.
CPC .......... *H01L 23/482* (2013.01); *H01L 21/743* (2013.01); *H01L 23/4824* (2013.01); *H01L 23/4825* (2013.01); *H01L 23/66* (2013.01); *H01L 27/0203* (2013.01); *H01L 27/0207* (2013.01); *H01L 27/1203* (2013.01); *H01L 29/1087* (2013.01); *H01L 29/41733* (2013.01); *H01L 29/78615* (2013.01);

(Continued)

(58) Field of Classification Search
CPC ............. H01L 23/482; H01L 29/41733; H01L 29/78654; H01L 29/78615; H01L 23/4824; H01L 21/743; H01L 29/1087; H01L 27/0203; H01L 27/0207; H01L 23/4825; H01L 23/66; H01L 27/1203; H01L 21/82385; H01L 21/823456; H01L 2223/6677; H01L 2924/1421; H04B 1/40
See application file for complete search history.

(56) References Cited

U.S. PATENT DOCUMENTS

| | | | | |
|---|---|---|---|---|
| 9,680,011 B2* | 6/2017 | Zhang | ................. | H01L 29/0642 |
| 2008/0157222 A1* | 7/2008 | Wang | ................. | H01L 27/0207 |
| | | | | 257/401 |

(Continued)

*Primary Examiner* — Ismail A Muse
(74) *Attorney, Agent, or Firm* — Chang & Hale LLP

(57) ABSTRACT

The fabrication of field-effect transistor (FET) devices is described herein where the FET devices include one or more body contacts implemented between source, gate, drain (S/G/D) assemblies to improve the influence of a voltage applied at the body contact on the S/G/D assemblies. The FET devices can include source fingers and drain fingers interleaved with gate fingers. The source and drain fingers of a first S/G/D assembly can be electrically connected to the source and drain fingers of a second S/G/D assembly.

20 Claims, 9 Drawing Sheets

Related U.S. Application Data

(60) Provisional application No. 62/316,518, filed on Mar. 31, 2016, provisional application No. 62/316,519, filed on Mar. 31, 2016.

(51) Int. Cl.
  *H04B 1/40* (2015.01)
  *H01L 21/8234* (2006.01)
  *H01L 21/8238* (2006.01)

(52) U.S. Cl.
  CPC ......... *H01L 29/78654* (2013.01); *H04B 1/40* (2013.01); *H01L 21/82385* (2013.01); *H01L 21/823456* (2013.01); *H01L 2223/6677* (2013.01); *H01L 2924/1421* (2013.01)

(56) References Cited

U.S. PATENT DOCUMENTS

| | | | | |
|---|---|---|---|---|
| 2009/0315080 A1* | 12/2009 | Stribley | ............ | H01L 27/0705 257/208 |
| 2012/0061768 A1* | 3/2012 | Sasaki | ............ | H01L 29/78 257/371 |
| 2013/0270635 A1* | 10/2013 | Parris | ............ | H01L 29/0847 257/336 |
| 2014/0346601 A1* | 11/2014 | Sugiura | ............ | H01L 29/78 257/347 |
| 2015/0003306 A1* | 1/2015 | Domino | ............ | H03H 11/28 370/297 |
| 2015/0041917 A1* | 2/2015 | Zhu | ............ | H01L 27/1203 257/392 |
| 2015/0129965 A1* | 5/2015 | Roy | ............ | H01L 27/1203 257/347 |
| 2015/0171898 A1* | 6/2015 | Blin | ............ | H01L 27/1203 455/127.1 |
| 2015/0287820 A1* | 10/2015 | Mallikarjunaswamy | ............ | H01L 29/4238 257/341 |
| 2015/0364576 A1* | 12/2015 | Zhang | ............ | H01L 29/78615 438/286 |
| 2016/0099341 A1* | 4/2016 | Yang | ............ | H01L 21/76264 438/157 |
| 2016/0225709 A1* | 8/2016 | Roy | ............ | H01L 29/4238 |
| 2016/0336920 A1* | 11/2016 | Jordan | ............ | H01L 27/0629 |
| 2017/0125584 A1* | 5/2017 | Zhang | ............ | H01L 29/0619 |

\* cited by examiner

FABRICATING FIELD-EFFECT TRANSISTORS WITH BODY CONTACTS BETWEEN SOURCE, GATE AND DRAIN ASSEMBLIES

CROSS-REFERENCE TO RELATED APPLICATIONS

This application is a continuation of U.S. application Ser. No. 15/475,510 filed Mar. 31, 2017 and entitled "Body Contacts for Field-Effect Transistors," which claims priority to U.S. Prov. App. No. 62/316,518 filed Mar. 31, 2016, entitled "Body Contacts for Field-Effect Transistors," and to U.S. Prov. App. No. 62/316,519 filed Mar. 31, 2016, entitled "Body Contacts for Field-Effect Transistors," each of which is expressly incorporated by reference herein in its entirety for all purposes.

BACKGROUND

Field

The present disclosure generally relates to field-effect transistor (FET) devices and more particularly to body contacts for such FET devices.

Description of Related Art

In electronics applications, field-effect transistors (FETs) can be utilized as switches and in amplifiers. Switches can allow, for example, routing of radio-frequency (RF) signals in wireless devices. Amplifiers can amplify signals for transmission or amplify received signals.

SUMMARY

According to a number of implementations, the present disclosure relates to a field-effect transistor (FET) that includes a first assembly of source, gate, and drain implemented on a first active region; a second assembly of source, gate, and drain implemented on a second active region; and a first body contact implemented between the first assembly and the second assembly.

In some embodiments, the FET includes a silicon-on-insulator (SOI) substrate. In some embodiments, the first assembly and the second assembly are dimensioned substantially the same and the first body contact is positioned at approximately the center of the FET.

In some embodiments, the FET also includes a third assembly of source, gate, and drain implemented on a third active region, and a second body contact implemented between the second assembly and the third assembly. In further embodiments, the first assembly and the third assembly are dimensioned substantially the same such that the first body contact and the second body contact are positioned substantially symmetrically about a center line of the FET.

In some embodiments, each of the first and second assemblies of respective source, gate, and drain is implemented in a finger configuration with gate fingers extending in a direction to provide a folded T-shaped body contact configuration for the first body contact and the gate fingers of the first and second assemblies. In further embodiments, the finger configuration of each of the first and second assemblies results in source and drain fingers being interleaved with the gate fingers. In yet further embodiments, the source fingers and the drain fingers are arranged in alternating rows. In yet further embodiments, a particular source finger of the first assembly is electrically connected to a source finger of the second assembly that is positioned on the same row as the particular source finger of the first assembly. In yet further embodiments, a particular drain finger of the first assembly is electrically connected to a drain finger of the second assembly that is positioned on the same row as the particular drain finger of the first assembly. In further embodiments, a particular source finger of the first assembly is electrically connected to a source finger of the second assembly that is offset by one row from the particular source finger of the first assembly. In yet further embodiments, a particular drain finger of the first assembly is electrically connected to a drain finger of the second assembly that is offset by one row from the particular drain finger of the first assembly.

In some embodiments, the first body contact further includes a first connecting metal extending along a width of the first body contact on a first side and a second connecting metal extending along a width of the first body contact on a second side opposite the first side. In further embodiments, a first plurality of gate fingers electrically coupled to the first connecting metal that extends away from the first connecting metal over the first active region and a second plurality of gate fingers electrically coupled to the second connecting metal that extends away from the second connecting metal over the second active region. In yet further embodiments, the FET also includes a third connecting metal that electrically couples the first connecting metal and the second connecting metal to electrically connect the first plurality of gate fingers and the second plurality of gate fingers.

According to a number of implementations, the present disclosure relates to a radio-frequency (RF) module that includes a packaging substrate configured to receive a plurality of devices. The RF module also includes a die mounted on the packaging substrate, the die including a field-effect transistor (FET) having a first assembly of source, gate, and drain implemented on a first active region, the FET further including a second assembly of source, gate, and drain implemented on a second active region, the FET further including a body contact implemented between the first assembly and the second assembly.

In some embodiments, the RF module is a switch module. In some embodiments, the die is a silicon-on-insulator (SOI) die.

According to a number of implementations, the present disclosure relates to a wireless device that includes a transceiver configured to process radio-frequency (RF) signals. The wireless device also includes an RF module in communication with the transceiver, the RF module including a switching device having a field-effect transistor (FET), the FET including a first assembly of source, gate, and drain implemented on a first active region, the FET further including a second assembly of source, gate, and drain implemented on a second active region, the FET further including a body contact implemented between the first assembly and the second assembly. The wireless device also includes an antenna in communication with the RF module, the antenna configured to facilitate transmitting and/or receiving of the RF signals.

In some embodiments, the RF module is a switch module.

According to a number of implementations, the present disclosure relates to a field-effect transistor (FET) that includes an assembly of source, gate, and drain implemented on an active region; a first body contact implemented on a first side of the assembly; and a second body contact implemented on a second side of the assembly, the second side opposite the first side of the assembly.

In some embodiments, the FET also includes a plurality of gate fingers, a first connecting metal, and a second connecting metal that together form a gate contact for the FET device. In further embodiments, the plurality of gate fingers is coupled to the first connecting metal and to the second connecting metal. In yet further embodiments, the first connecting metal is implemented between the first body contact and the assembly and the second connecting metal is implemented between the second body contact and the assembly. In some embodiments, the first active region of the assembly includes a plurality of conductive features in rows between the plurality of gate fingers to form alternating strips of source and drain. In further embodiments, the conductive features include conductive vias.

In some embodiments, each of the first body contact and the second body contact includes a plurality of conductive features.

According to a number of implementations, the present disclosure relates to a method for fabricating a radio-frequency (RF) device, the method including forming a field-effect transistor (FET) over a substrate layer; electrically connecting the substrate layer to a substrate node; and coupling a non-grounding circuit to the substrate node to adjust RF performance of the FET.

According to a number of implementations, the present disclosure relates to a method for fabricating a field-effect transistor (FET), the method including forming or providing a substrate; implementing a first assembly of source, gate, and drain on a first active region of the substrate; implementing a second assembly of source, gate, and drain on a second active region of the substrate; and forming a first body contact between the first assembly and the second assembly.

In some embodiments, the substrate is a silicon-on-insulator (SOI) substrate.

According to a number of implementations, the present disclosure relates to a method for fabricating a radio-frequency (RF) device, the method includes forming a field-effect transistor (FET) using the method of the above implementations; electrically connecting the substrate to a substrate node; and coupling a non-grounding circuit to the substrate node to adjust RF performance of the FET.

According to a number of implementations, the present disclosure relates to a field-effect transistor (FET) that includes a first assembly of source, gate, and drain implemented on a first active region, the first assembly having a first width and a first length; a second assembly of source, gate, and drain implemented on a second active region, the second assembly having a second width and a second length, such that the first width is greater than the second width and the first length is not equal to the second length; and a body contact implemented between the first assembly and the second assembly such that the body contact is away from a center of the FET.

In some embodiments, the FET includes a silicon-on-insulator (SOI) substrate. In some embodiments, the FET also includes a plurality of gate fingers, a first connecting metal, and a second connecting metal that together form a gate contact for the FET device. In further embodiments, the first active region of the assembly includes a plurality of conductive features in rows between the plurality of gate fingers to form alternating strips of source and drain.

In some embodiments, the body contact further includes a first connecting metal extending along a width of the body contact on a first side and a second connecting metal extending along a width of the body contact on a second side opposite the first side. In further embodiments, the FET also includes a first plurality of gate fingers electrically coupled to the first connecting metal that extends away from the first connecting metal over the first active region and a second plurality of gate fingers electrically coupled to the second connecting metal that extends away from the second connecting metal over the second active region, the number of gate fingers of the first plurality of gate fingers being different from the number of gate fingers of the second plurality of gate fingers.

In some embodiments, each of the first and second assemblies of respective source, gate, and drain is implemented in a finger configuration with gate fingers extending in a direction to provide a folded T-shaped body contact configuration for the first body contact and the gate fingers of the first and second assemblies.

According to a number of implementations, the present disclosure relates to a field-effect transistor (FET) that includes a first assembly of source, gate, and drain implemented on a first active region; a second assembly of source, gate, and drain implemented on a second active region, the second assembly aligned with the first assembly in a first row; a third assembly of source, gate, and drain implemented on a second active region, the third assembly aligned with the first assembly in a first column; a fourth assembly of source, gate, and drain implemented on a second active region, the fourth assembly aligned with the second assembly in a second column and with the third assembly in a second row; and a body contact assembly implemented between the first assembly, the second assembly, the third assembly, and the fourth assembly.

In some embodiments, the FET includes a silicon-on-insulator (SOI) substrate. In some embodiments, the body contact assembly is positioned between the first row and the second row and between the first column and the second column. In further embodiments, the body contact assembly forms a cross shape.

In some embodiments, the body contact assembly includes a first body contact implemented between the first and second assemblies and a second body contact implemented between the third and fourth assemblies. In some embodiments, the body contact assembly includes a first body contact implemented between the first and third assemblies and a second body contact implemented between the second and fourth assemblies. In some embodiments, the body contact assembly includes a first body contact implemented between the first and second assemblies, a second body contact implemented between the third and fourth assemblies, a third body contact implemented between the first and third assemblies, and a fourth body contact implemented between the second and fourth assemblies.

In some embodiments, each of the first, second, third, and fourth assemblies of respective source, gate, and drain is implemented in a finger configuration with gate fingers extending over the first, second, third, and fourth active regions to provide alternating rows of source and drain interleaved with the gate fingers. In some embodiments, the first assembly has a first width and a first length and the second assembly has a second width and a second length such that the first width is greater than the second width. In further embodiments, the first length is greater than the second length.

According to a number of implementations, the present disclosure relates to a radio-frequency (RF) module that includes a packaging substrate configured to receive a plurality of devices. The RF module also includes a die mounted on the packaging substrate, the die including a field-effect transistor (FET) having a first assembly of source, gate, and drain implemented on a first active region, the first assembly having a first width and a first length, the die further including a second assembly of source, gate, and drain implemented on a second active region, the second assembly having a second width and a second length, such that the first width is greater than the second width and the first length is not equal to the second length, and the die further including a body contact implemented between the first assembly and the second assembly such that the body contact is away from a center of the FET.

In some embodiments, the RF module is a switch module. In some embodiments, the die is a silicon-on-insulator (SOI) die.

For purposes of summarizing the disclosure, certain aspects, advantages and novel features have been described herein. It is to be understood that not necessarily all such advantages may be achieved in accordance with any particular embodiment. Thus, one or more of the disclosed features may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Disclosed herein are various examples related to body contacts for field-effect transistors (FETs). FETs, such as those having silicon-on-insulator (SOI) process technology, are utilized in many radio-frequency (RF) circuits, including those involving high performance, low loss, high linearity switches. In such RF switching circuits, performance advantage typically results from building a transistor in silicon, which sits on an insulator such as an insulating buried oxide (BOX). The BOX typically sits on a handle wafer, typically silicon, but can be glass, borosilicon glass, fused quartz, sapphire, silicon carbide, or any other electrically-insulating material.

In various examples herein, FETs are sometimes described in the context of such SOI technology. However, it will be understood that one or more features of the present disclosure can also be implemented in other types of FETs.

Figure 1:
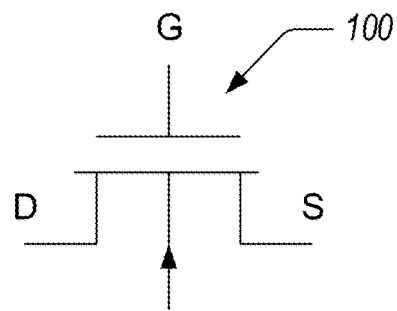
FIG. 1 illustrates a terminal representation of a FET having nodes associated with a gate, a source, a drain and a body.

FIG. 1 illustrates a terminal representation of a FET 100 having nodes associated with a gate, a source, a drain and a body. Examples related to contacts for such a body are described herein in greater detail.

Figure 2:
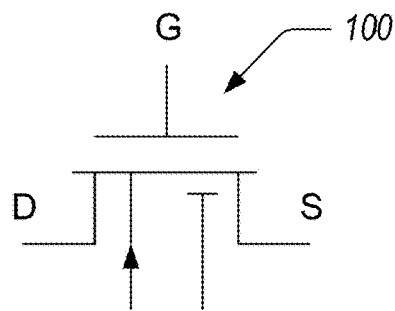
FIG. 2 illustrates a FET having a body contact configuration as well as a substrate node.

FIG. 2 illustrates that, in some embodiments, a FET 100 having a body contact configuration as described herein can also include a substrate node. Among others, U.S. Pat. Pub. No. 2016/0322385 published Nov. 3, 2016 and entitled "Substrate bias for field-effect transistor devices," which is expressly incorporated herein by reference in its entirety, discloses additional details about how such a substrate node can be biased and/or coupled to one or more other nodes of the transistor to, for example, improve both linearity and loss performance of the transistor.

U.S. Pat. Pub. No. 2016/0322385 also discloses examples of how FET devices having one or more features as described herein can be fabricated as wafers, as well as various applications that utilize such FET devices. U.S. Pat. Pub. No. 2016/0322385 also discloses examples of various products that can include such FET devices.

Figure 3A:
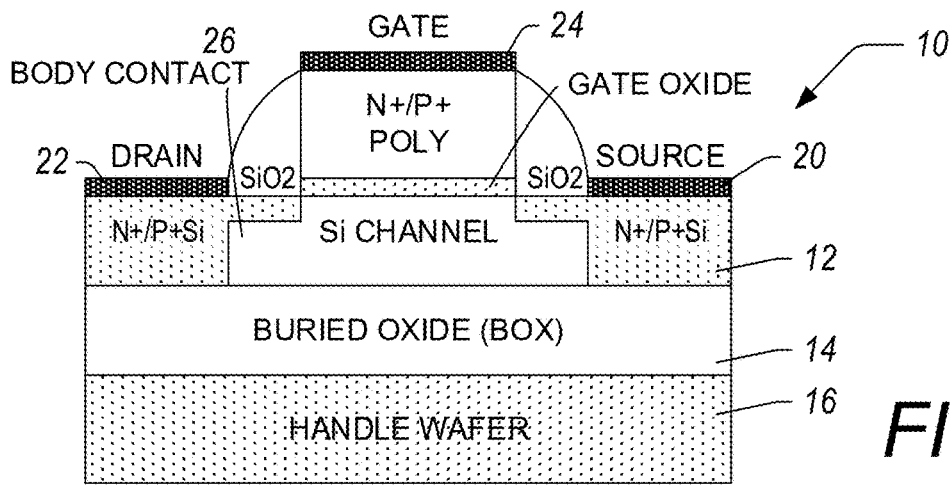
FIGS. 3A and 3B respectively illustrate side sectional and plan views of an example SOI FET device having an active FET implemented over a substrate such as a silicon substrate associated with a handle wafer.
Figure 3B:
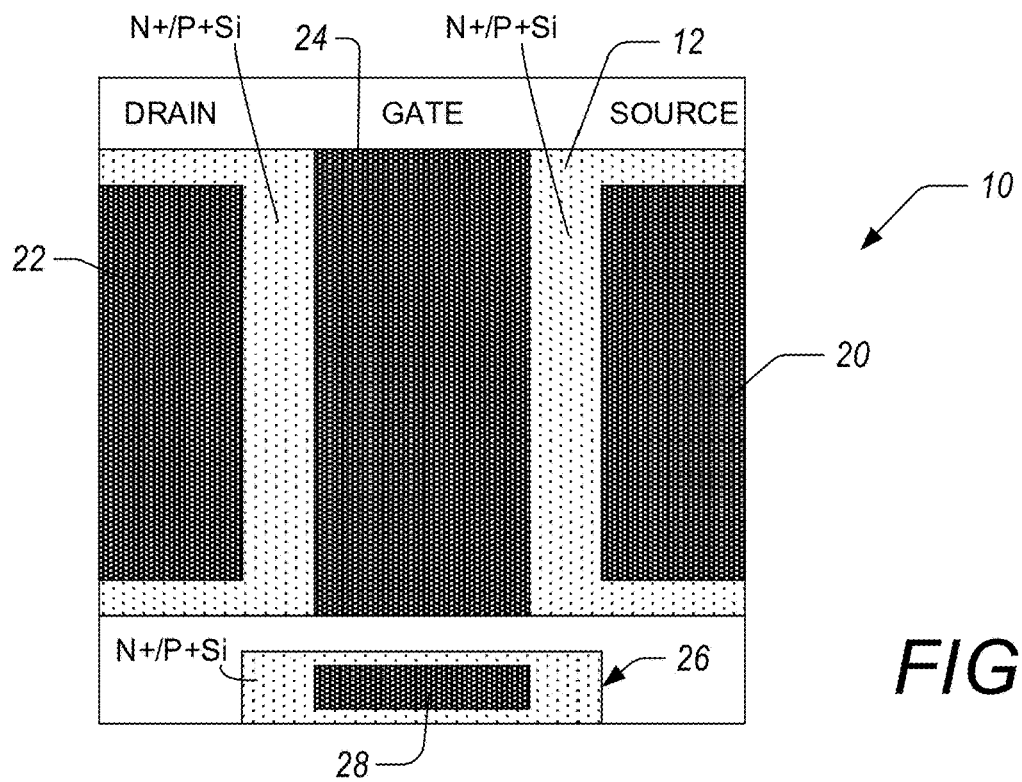

FIGS. 3A and 3B respectively illustrate side sectional and plan views of an example SOI FET device 10 having an active FET implemented over a substrate such as a silicon substrate associated with a handle wafer 16. Although described in the context of such a handle wafer, it will be understood that the substrate does not necessarily need to have functionality associated with a handle wafer.

An insulator layer such as a BOX layer 14 can be formed over the handle wafer 16, and the active FET can be formed based on an active silicon device 12 over the BOX layer 14. In various examples described herein, and as illustrated in FIGS. 3A and 3B, the active FET can be configured as an NPN or PNP device.

In the example of FIGS. 3A and 3B, terminals for the gate 24, source 20, drain 22 and body 26 can be configured and provided to allow operation of the FET. It will be understood that in some embodiments, the source and the drain can be interchanged.

Referring to FIGS. 3A and 3B, a contact feature 28 provides an electrical contact with the body 26. It is noted that in the example of FIGS. 3A and 3B, such a body contact feature 28 is located at one end of the FET device 10.

In general, a body contact is typically utilized to control a voltage potential associated with the FET body. If the body contact is implemented at an end of a given FET device, such as in the example of FIGS. 3A and 3B, such voltage controlling influence provided by the body contact may weaken significantly at locations relatively far away from the body contact.

Figure 4:
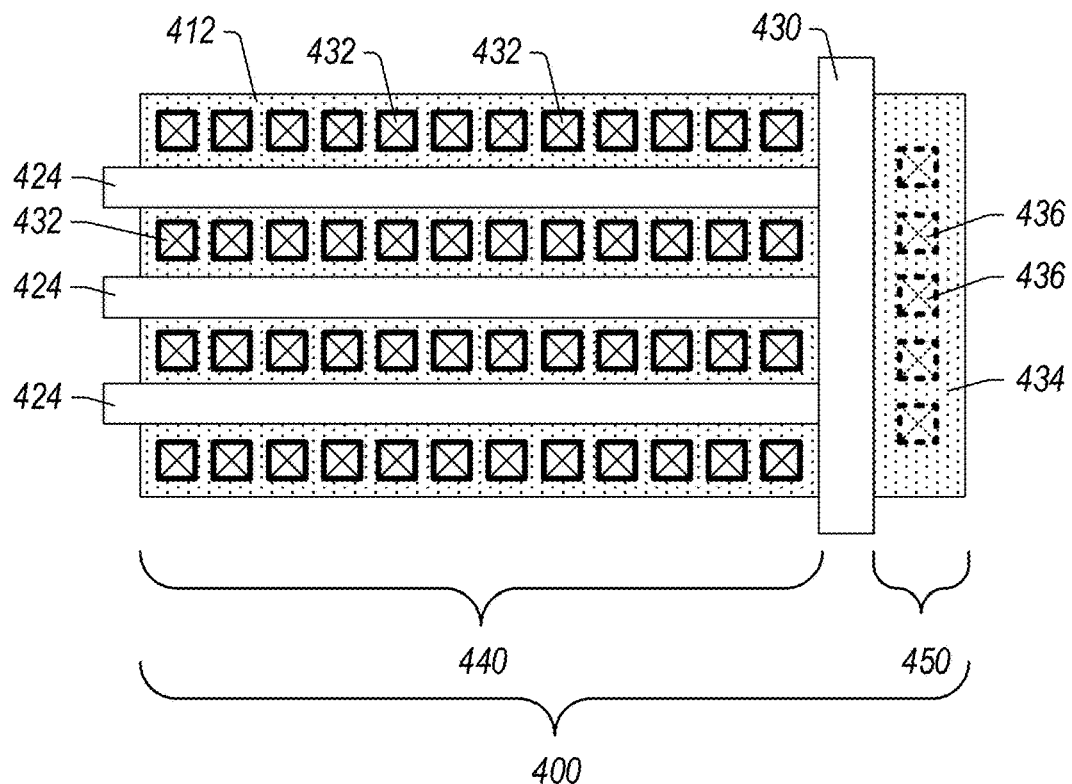
FIG. 4 illustrates an example of a FET device having a T-shaped body contact configuration.

For example, FIG. 4 illustrates an example of a FET device 400 having a T-shaped body contact configuration. More particularly, a plurality of conductive features 436 such as conductive vias can be implemented on a region of a body 434 to generally form a body contact 450. In the example of FIG. 4, such a body contact 450 generally forms a "T" shape along with the direction of a plurality of gate fingers 424.

In the example of FIG. 4, the gate fingers 424 and a connecting metal 430 can collectively form a gate contact for the FET device 400. Portions of an active region 412 between the gate fingers 424 can be provided with a plurality of conductive features 432 such as conductive vias to form alternating strips of source and drain for the FET device 400.

In the example of FIG. 4, the foregoing configuration generally results in an assembly of source, gate and drain generally occupying a region indicated as 440, and the body contact occupying a region indicated as 450. To facilitate the description herein, the region 440 may be referred to as an assembly of source, gate and drain, or simply as S/G/D, an S/G/D region, or an S/G/D assembly. Similarly, the region 450 may be referred to herein as a body contact, a body, or the like.

Figure 5:
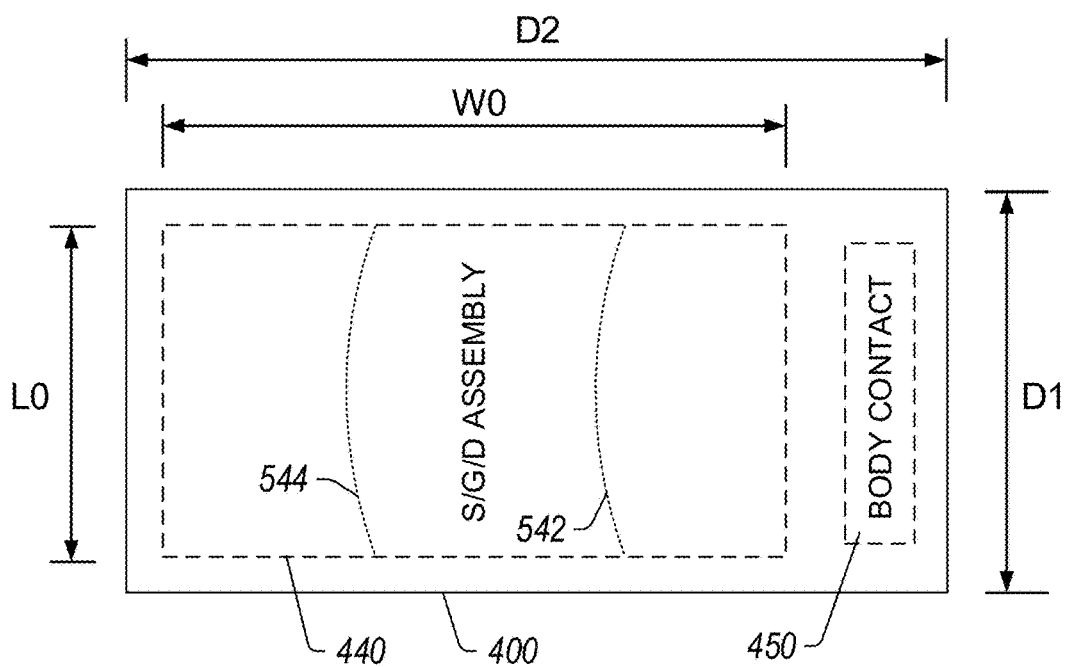
FIG. 5 illustrates a block diagram of the FET of FIG. 4.

FIG. 5 illustrates a block diagram of the example FET device 400 of FIG. 4. Such a FET device can have an overall dimension of D1×D2. The S/G/D region 440 has a width of W0, and a length of L0. The body contact 450 can be positioned on one end of the width (W0) dimension.

Depicted in the S/G/D region 440 are examples of influence contour lines 542, 544 that can result from, for example, application of a voltage at the body contact 450. Generally, such an influence from the body contact 450 decreases as distance increases. Accordingly, the body contact influence in a first example region between the body contact 450 and the first influence contour line 542 is generally stronger than the body contact influence in a second example region between the first influence contour line 542 and the second influence contour line 544. Similarly, the body contact influence beyond the second influence contour line 544 is generally weaker than the body contact influence in the second region. Accordingly, a relatively weak control of the body can result in FET devices such as that of FIGS. 4 and 5. For example, the region to the left of the second influence contour line 544 (when viewed as depicted in FIG. 5) can have a relatively weak body control when compared to the region to the right of the first influence contour line 542.

Figure 6:
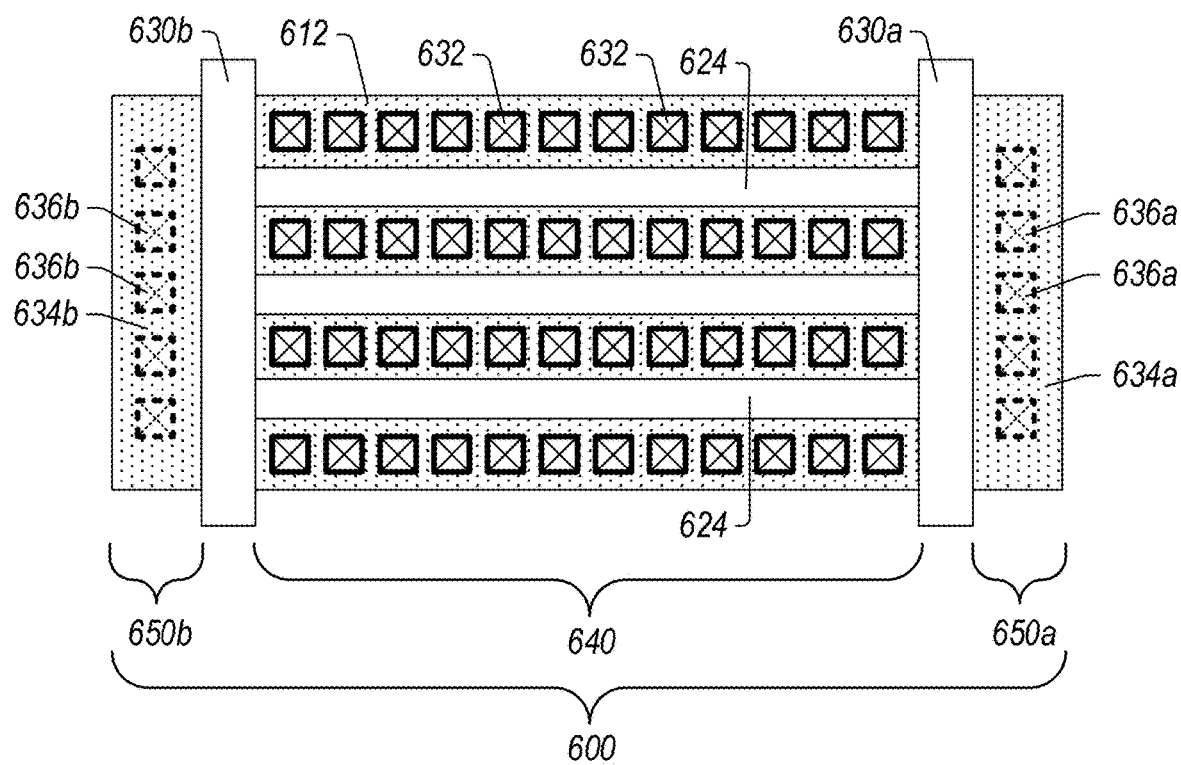
FIG. 6 illustrates an example of a FET device having an H-shaped body contact configuration.
Figure 7:
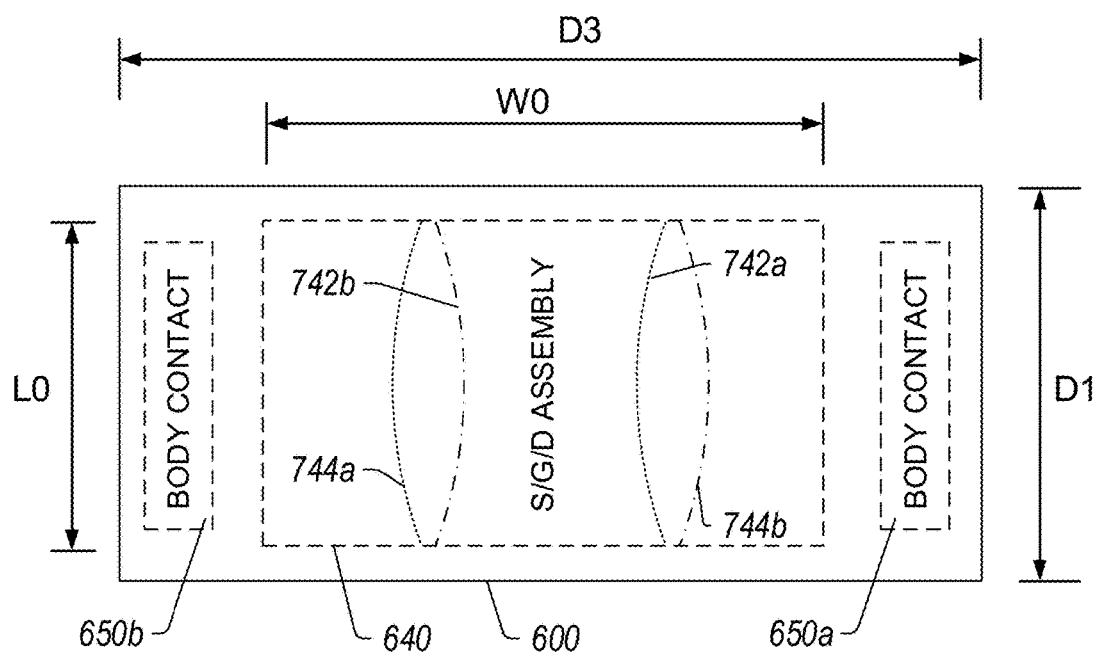
FIG. 7 illustrates a block diagram of the FET of FIG. 6.

FIGS. 6 and 7 illustrate another example FET device 600 having a configuration similar to the example FET device 400 of FIGS. 4 and 5, but with an additional body contact implemented on the opposite end of an S/G/D region 640. More particularly, the S/G/D region 640 can include a plurality of gate fingers 624, and strips of source and drain about such gate fingers. The gate fingers 624 can be connected by first and second connecting metals 630a, 630b to form a gate contact for the FET device 600.

A first body contact 650a can be implemented on the first end of the FET device 600 (e.g., the right side in the example FET device 600). Similarly, a second body contact 650b can be implemented on the second end of the FET device 600. Accordingly, the two body contacts 650a, 650b and the direction of the gate fingers 624 generally form an "H" shape.

To merely facilitate the description of the FET device 600, suppose that the S/G/D region 640 is dimensioned (L0×W0) similar to the example of FIGS. 4 and 5. In such a configuration, the first body contact 650a can exert its influence as depicted by first and second influence contour lines 742a, 744a. Similarly, the second body contact 650b can exert its influence as depicted by first and second influence contour lines 742b, 744b.

Accordingly, the weak body contact influence region (e.g., on the left side) in the example of FIGS. 4 and 5 is now strongly influenced by the second body contact 650b. However, such a dual body contact configuration involves addition of the second body contact. Still assuming the same S/G/D region dimensions (L0×W0) among the examples of FIGS. 4 and 5 and FIGS. 6 and 7, such a second body contact may increase the overall dimensions of the FET device 600. For example, the D2 dimension of the example FET device of FIGS. 4 and 5 is increased to a dimension of D3.

In some embodiments, a FET device can include a body contact that can be implemented between a first S/G/D region and a second S/G/D region. Such a configuration can address at least some of the foregoing issues described with reference to FIGS. 4-7, as well as provide additional advantageous features described herein.

Figure 8:
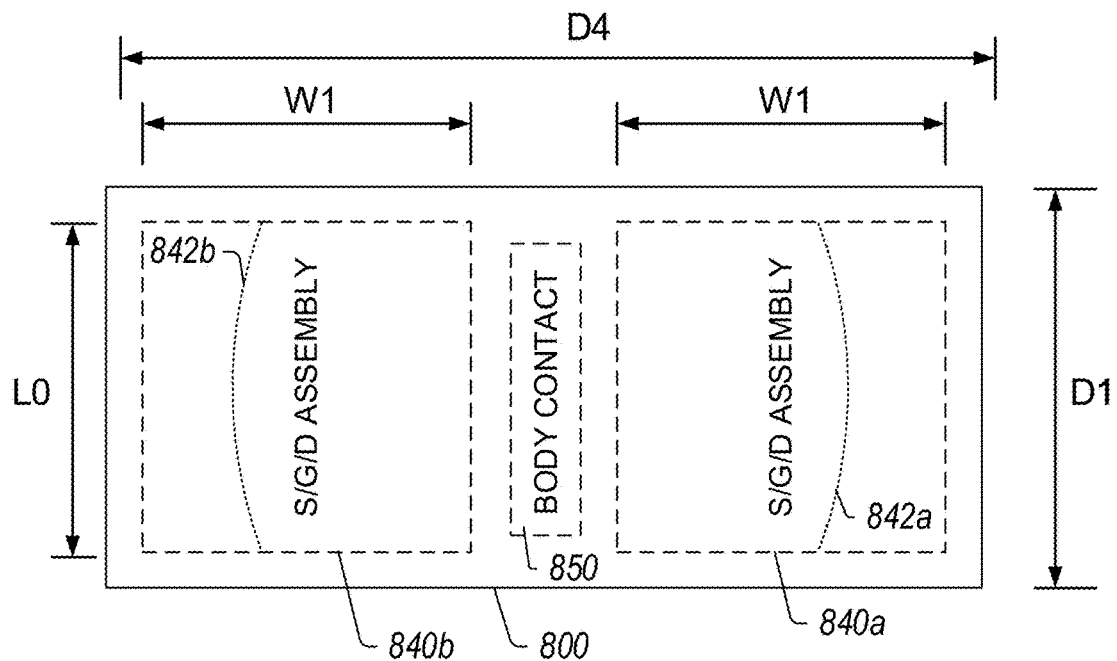
FIG. 8 illustrates a block diagram of a FET device having a folded T-shaped body contact configuration.

FIG. 8 illustrates a block diagram of a FET device 800 having a body contact 850 implemented between a first S/G/D assembly 840a implemented on a first active region 812a and a second S/G/D assembly 840b implemented on a second active region 812b. The first assembly 840a and the second assembly 840b can be dimensioned such that the body contact 850 is positioned so that it bridges the center of the FET device 800. In some embodiments, the body contact 850 can be positioned at approximately the center of the FET device 800. Such an arrangement of the first S/G/D assembly 840a, the body contact 850, and the second S/G/D assembly 840b can be along a direction of gate fingers 824a, 824b. An example of such an arrangement is illustrated in FIG. 9.

Figure 9:
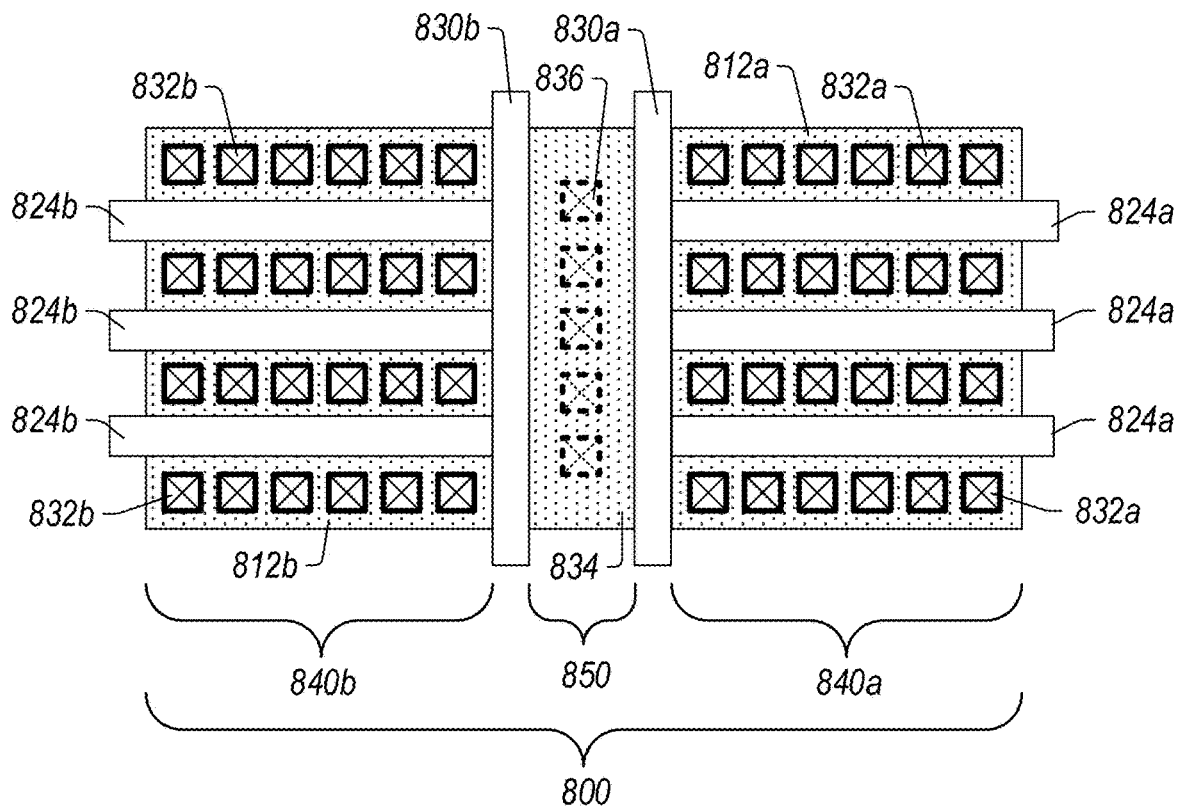
FIG. 9 illustrates an example configuration of the FET device of FIG. 8.

In the example of FIG. 9, the body contact 850 includes a plurality of conductive features 836 implemented to provide an electrical contact with a body 850. The first S/G/D assembly 840a includes a plurality of gate fingers 824a implemented over a first active region 812a to define strips or rows of the first active region 812a. A plurality of conductive features 832a are implemented for such strips to form source and drains. When connected appropriately such strips with corresponding conductive features can function as alternating source and drain strips or rows. The gate fingers 824a of the first S/G/D assembly 840a can be interconnected by a connecting metal 830a.

Similarly, the second S/G/D assembly 840b includes a plurality of gate fingers 824b implemented over a second active region 812b to define strips or rows of the second active region 812b. A plurality of conductive features 832b are implemented for such strips to form source and drains. When connected appropriately such strips with corresponding conductive features can function as alternating source and drain strips. The gate fingers 824b of the second S/G/D assembly 840b can be interconnected by a connecting metal 830b.

The connecting metal 830a for the first gate fingers 824a and the connecting metal 830b for the second gate fingers 824b may or may not be interconnected. In the example of FIG. 9, the conductive features 836 associated with the body contact 850 and the conductive features 832a, 832b associated with the source and drain strips can include, for example, conductive vias, conductive trenches, or some combination thereof.

The following observations can be made comparing the example of FIGS. 8 and 9 with the example of FIGS. 4 and 5. Merely for the purpose of such a comparison, suppose that the length dimension of each of the first and second S/G/D assemblies 840a, 840b of FIGS. 8 and 9 is L0, approximately the same as that of the S/G/D assembly 440 of FIGS. 4 and 5. Further, suppose that the overall width dimension of the first S/G/D assembly 840a, the body contact 850, and the second S/G/D assembly 840b (W1+body contact width+W1) of FIGS. 8 and 9 is similar to the overall width dimension of the body contact 450 and the S/G/D assembly 440 (body contact width+W0) of FIGS. 4 and 5. In such a comparison, the width W1 can be approximately half of the width W0.

In such a configuration of FIGS. 8 and 9, it is apparent that most of each of the first and second S/G/D assemblies 840a, 840b is strongly influenced by the common body contact 850. More particularly, the first influence contour line 842a on the right side of the body contact 850 covers much of the first S/G/D assembly 840a. Similarly, the first influence contour line 842b on the left of the body contact 850 covers much of the second S/G/D assembly 840b.

In the foregoing comparison of the FET device 400 of FIGS. 4 and 5 and the FET device 800 of FIGS. 8 and 9, one can see that improved body contact influence can be obtained with the configuration of FIGS. 8 and 9 while utilizing a single body contact and maintaining a similar area for S/G/D functionality.

The following observations can be made when the example of FIGS. 8 and 9 is compared to the example of FIGS. 6 and 7. Merely for the purpose of such a comparison, suppose again that the length dimension of each of the first and second S/G/D assemblies 840a, 840b of FIGS. 8 and 9 is L0, approximately same as that of the S/G/D assembly 640 of FIGS. 6 and 7. Further, suppose that the overall width dimension of the first S/G/D assembly 840a, the body contact 850, and the second S/G/D assembly 840b is W1+body contact width+W1 in FIGS. 8 and 9, and that the overall width dimension of the first body contact 650a, the S/G/D assembly 640, and the second body contact 650b is body contact width+W0+body contact width in FIGS. 6 and 7.

In such a comparison, if the width W1 is assumed to be approximately half of the width W0, the foregoing overall width dimension in the example of FIGS. 6 and 7 is greater than the overall width dimension in the example of FIGS. 8 and 9 by approximately one body contact width. Accordingly, one can see that while the body contact influence is relatively strong in both examples (of FIGS. 6 and 7 and of FIGS. 8 and 9), the configuration in the example of FIGS. 8 and 9 can achieve a relatively strong influence with one less body contact and less overall area.

To facilitate the discussion herein, the example configuration of FIGS. 8 and 9 can be referred to as a folded configuration, with the common body contact 850 generally defining a fold line. Such a common body contact forms a T-shaped configuration with the first gate fingers 824a. The same common body contact 850 also forms a T-shaped configuration with the second gate fingers 824b. Accordingly, the example configuration of FIGS. 8 and 9 can also be referred to as a folded T-shaped body contact configuration. For example, the first gate fingers 824a and the second gate fingers 824b extend in a direction substantially perpendicular to the respective connecting metals 830a, 830b, forming the T-shaped configuration. The configuration of the respective gate fingers 824a, 824b also results in source and drain fingers being interleaved with the gate fingers 824a, 824b on each of the first assembly 840a and the second assembly 840b. In some embodiments, the source and drain fingers of the respective assemblies 840a, 840b are arranged in alternating strips or rows.

Figure 10:
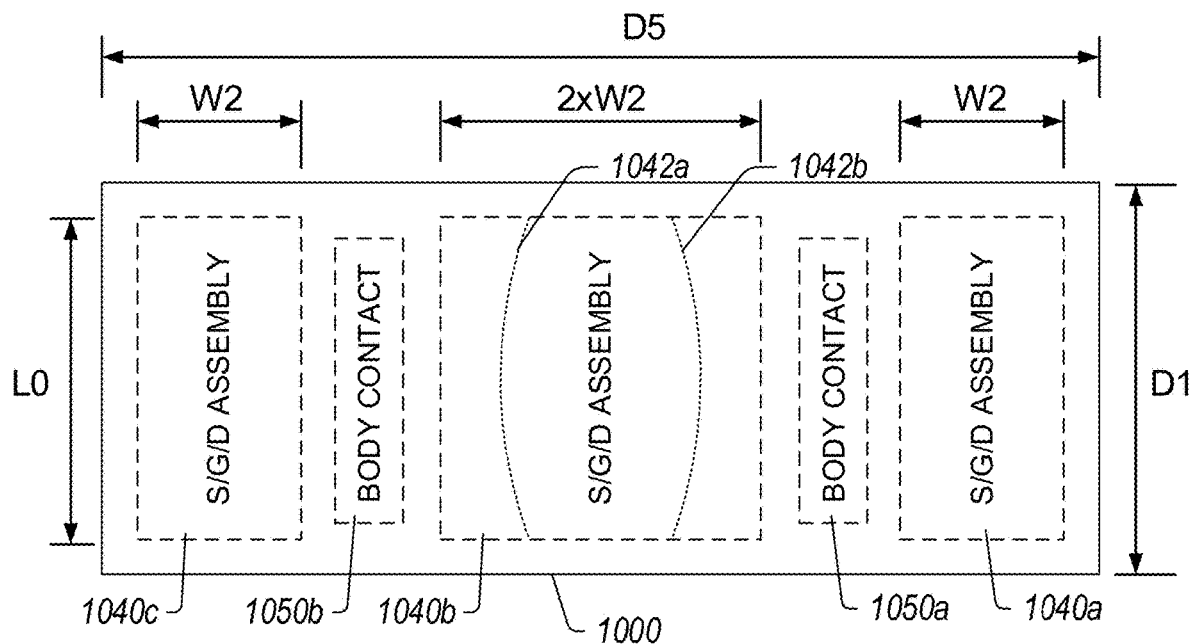
FIG. 10 illustrates a block diagram of a FET device having a double-folded T-shaped body contact configuration.
Figure 11:
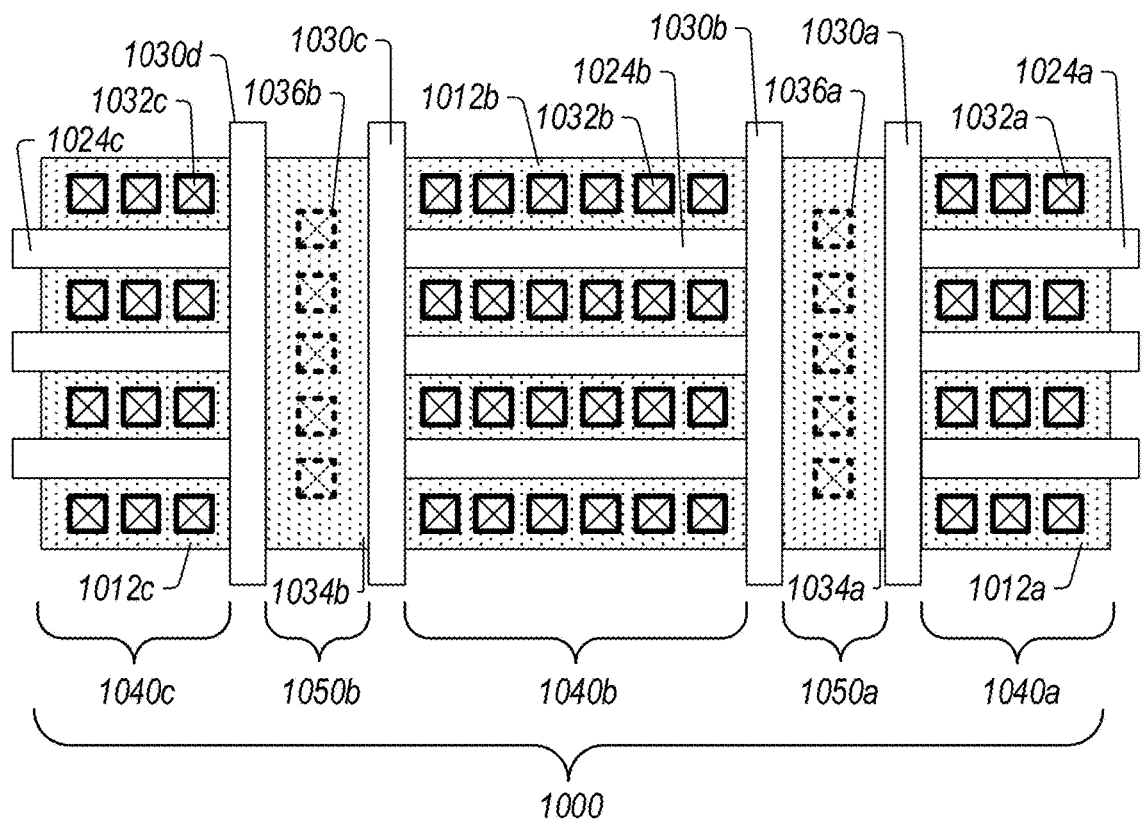
FIG. 11 illustrates an example configuration of the FET device of FIG. 10.

FIGS. 10 and 11 illustrate that, in some embodiments, two body contacts can be implemented within a FET device 1000. A first body contact 1050a can be implemented between a first S/G/D assembly 1040a implemented on a first active region 1012a and a second S/G/D assembly 1040b implemented on a second active region 1012b, and a second body contact 1050b can be implemented between the second S/G/D assembly 1040b and a third S/G/D assembly 1040c implemented on a third active region 1012c. In some embodiments, the first assembly 1040a and the third assembly 1040c are dimensioned substantially the same such that the first body contact 1050a and the second body contact 1050b are positioned substantially symmetrically about a center line of the FET device 1000.

The first body contact 1050a includes a plurality of first conductive features 1036a implemented to provide an electrical contact with a first body 1034a. Similarly, the second body contact 1050b includes a plurality of second conductive features 1036b implemented to provide an electrical contact with a second body 1034b.

Referring to FIG. 11, the first S/G/D assembly 1040a includes a plurality of gate fingers 1024a implemented over a first active region 1012a to define strips or rows of the first active region 1012a. A plurality of conductive features 1032a can be implemented for such strips to form source and drains. When connected appropriately, such strips with corresponding conductive features can function as alternating source and drain strips or rows. The gate fingers 1024a of the first S/G/D assembly 1040a can be interconnected by a connecting metal 1030a.

The second S/G/D assembly 1040b includes a plurality of gate fingers 1024b implemented over a second active region 1012b to define strips or rows of the second active region 1012b. A plurality of conductive features 1032b can be implemented for such strips or rows to form source and drains. When connected appropriately such strips with corresponding conductive features can function as alternating source and drain strips or rows. The gate fingers 1024b of the second S/G/D assembly 1040b can be interconnected by a connecting metal 1030b on one end and a connecting metal 1030c on the other end.

The third S/G/D assembly 1040c includes a plurality of gate fingers 1024c implemented over a third active region 1012c to define strips or rows of the third active region 1012c. A plurality of conductive features 1032c can be implemented for such strips or rows to form source and drains. When connected appropriately such strips with corresponding conductive features can function as alternating source and drain strips or rows. The gate fingers 1024c of the third S/G/D assembly 1040c can be interconnected by a connecting metal 1030d.

In the example of FIG. 11, the connecting metal 1030a for the first gate fingers 1024a and the connecting metal 1030b for the second gate fingers 1024b may or may not be interconnected. Similarly, the connecting metal 1030c for the second gate fingers 1024b and the connecting metal 1030d for the third gate fingers 1024c may or may not be interconnected.

In the example of FIG. 11, the conductive features 1036a, 1036b associated with the first and second body contacts 1050a, 1050b, and the conductive features 1032a, 1032b, 1032c associated with the source and drain strips can include, for example, conductive vias, conductive trenches, or some combination thereof.

The following observations can be made when comparing the example of FIGS. 10 and 11 with the example of FIGS. 6 and 7. Merely for the purpose of such a comparison, suppose that the length dimension of each of the first, second and third S/G/D assemblies 1040a, 1040b, 1040c of FIGS. 10 and 11 is L0, approximately the same as that of the S/G/D assembly 40 of FIGS. 6 and 7. Further, suppose that the overall width dimension of the first S/G/D assembly 1040a, the first body contact 1050a, the second S/G/D assembly 1040b, the second body contact 1050b, and the third S/G/D assembly 1040c (W2+body contact width+2×W2+body contact width+W2) of FIGS. 10 and 11 is similar to the overall width dimension of the first body contact 650a, the S/G/D assembly 640, and the second body contact 650b (body contact width+W0+body contact width) of FIGS. 6 and 7. In such a comparison, the width W2 can be approximately a quarter of the width W0.

In such a configuration of FIGS. 10 and 11, the farthest distance from a body contact (e.g., body contacts 1050a, 1050b) to any location on the S/G/D assemblies (e.g., S/G/D assemblies 1040a, 1040b, 1040c) is approximately W2 (e.g., a quarter of W0). In the configuration of FIGS. 6 and 7, however, the farthest distance from a body contact (e.g., body contacts 650a, 650b) to any location on the S/G/D assembly (e.g., S/G/D assembly 640) is approximately half of W0. Accordingly, the two body contacts 1050a, 1050b of FIGS. 10 and 11 being distributed differently than the two body contacts 650a, 650b of FIGS. 6 and 7 results in stronger body contact influence for the S/G/D assemblies of the former. For example, the first influence contour line 1042a associated with the first body contact 1050a can cover substantially all the first S/G/D assembly 1040a as well as most of the second S/G/D assembly 1040b. Similarly, the first influence contour line 1042b associated with the second body contact 1050b can cover substantially all the third S/G/D assembly 1040c as well as most of the second S/G/D assembly 1040b. It is apparent that the overlapping coverage of the first influence lines 1042a and 1042b results in the second S/G/D assembly 1040b being strongly influenced by the first and second body contacts 1050a, 1050b.

Merely for descriptive purposes, the example configuration of FIGS. 10 and 11 can be referred to as a double-folded configuration, with the two body contacts 1050a, 1050b generally defining two fold lines. The first body contact 1050a forms a T configuration with the first gate fingers 1024a and forms a T configuration with the second gate fingers 1024b. Similarly, the second body contact 1050b forms a T configuration with the third gate fingers 1024c and forms a T configuration with the second gate fingers 1024b. Accordingly, the example configuration of FIGS. 10 and 11 can also be referred to as a double-folded T-shaped body contact configuration.

In some embodiments, one or more additional body contacts can be introduced to provide further reduction in body contact-to-body contact spacing and thereby increase the body contact influence at various locations of a FET device. In some embodiments, such reduction in body contact-to-body contact spacing can be balanced with any introduction or increase in narrow-width effects.

Figure 12:
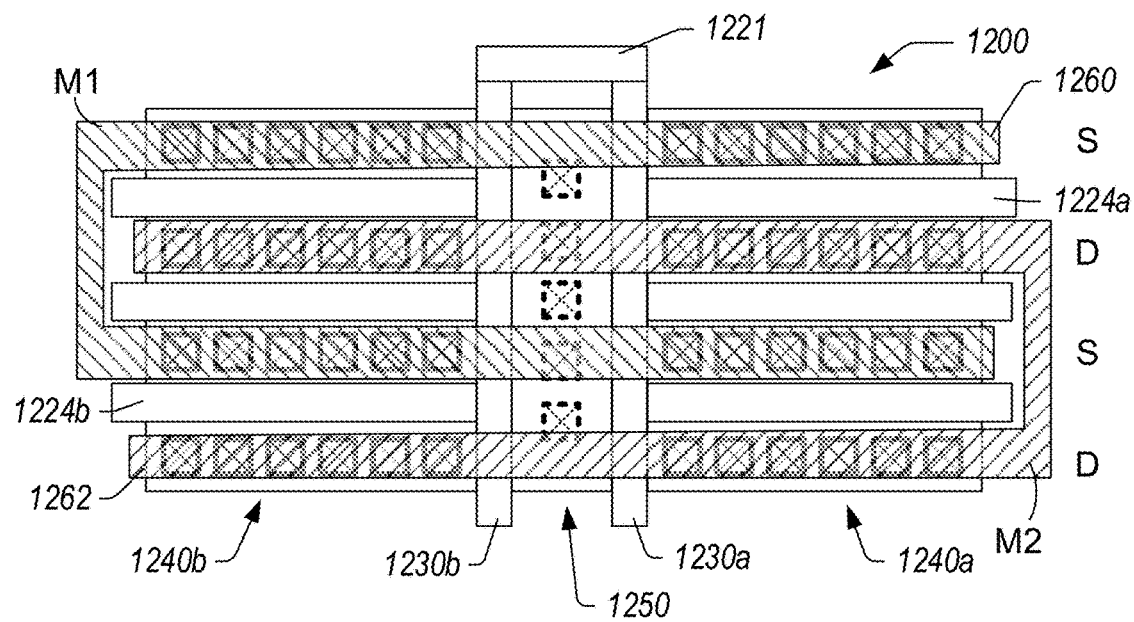
FIG. 12 illustrates an example configuration of a FET device with source and drain connections that alternate rows in a folded T-shaped body contact configuration.

FIGS. 12-15 illustrate examples of how source and drain connections can be implemented for the example FET devices 800, 1000 of FIGS. 9 and 11. More particularly, FIG. 12 illustrates a FET device 1200 that is similar to the FET device 800 of FIG. 9. In the example of FIG. 12, the connecting metal 1230a for the first gate fingers 1224a and the connecting metal 1230b for the second gate fingers 1224b can be interconnected by a connecting metal 1221 to electrically connect the gate fingers on both sides of the body contact 1250.

Figure 13:
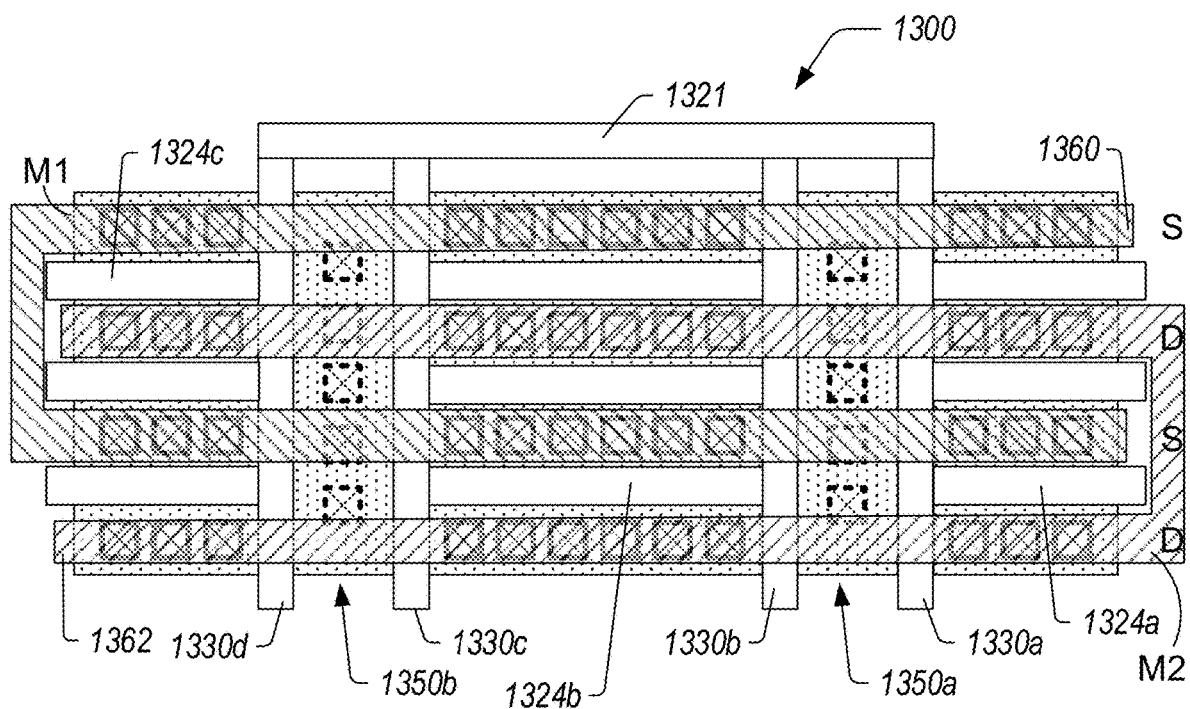
FIG. 13 illustrates an example configuration of a FET device with source and drain connections that alternate rows in a double-folded T-shaped body contact configuration.

Similarly, FIG. 13 illustrates a FET device 1300 that is similar to the FET device 1000 of FIG. 11. In the example of FIG. 13, the four connecting metals 1330a, 1330b, 1330c, 1330d can be interconnected by a connecting metal 1321 to electrically connect the gate fingers.

Referring to the example of FIG. 12, the alternating strips or rows of conductive features (e.g., conductive features 832a and 832b in FIG. 9) can be electrically coupled or connected by a first metal, and the other alternating rows of conductive features can be connected by a second metal. For example, conductive features of the first row at the top and the third row from the top can be connected by a first metal (e.g., using a first metal M1) to form a source connection 1260. Similarly, conductive features of the second row from the top and the fourth row from the top can be connected by the second metal (e.g., using a second metal M2) to form a drain connection 1262. In some embodiments, a particular source finger of a first assembly 1240a can be electrically connected to a source finger of a second assembly 1240b that is positioned on the same row as the particular source finger of the first assembly. Similarly, a particular drain finger of the first assembly 1240a can be electrically connected to a drain finger of the second assembly 1240b that is positioned on the same row as the particular drain finger of the first assembly.

Referring to the example of FIG. 13, the alternating rows of conductive features (e.g., conductive features 1032a, 1032b and 1032c in FIG. 11) can be connected by a first metal, and the other alternating rows of conductive features can be connected by a second metal. For example, conductive features of the first row at the top and the third row from the top can be connected by the first metal (e.g., M1) to form a source connection 1360. Similarly, conductive features of the second row from the top and the fourth row from the top can be connected by the second metal (e.g., M2) to form a drain connection 1362.

Figure 14:
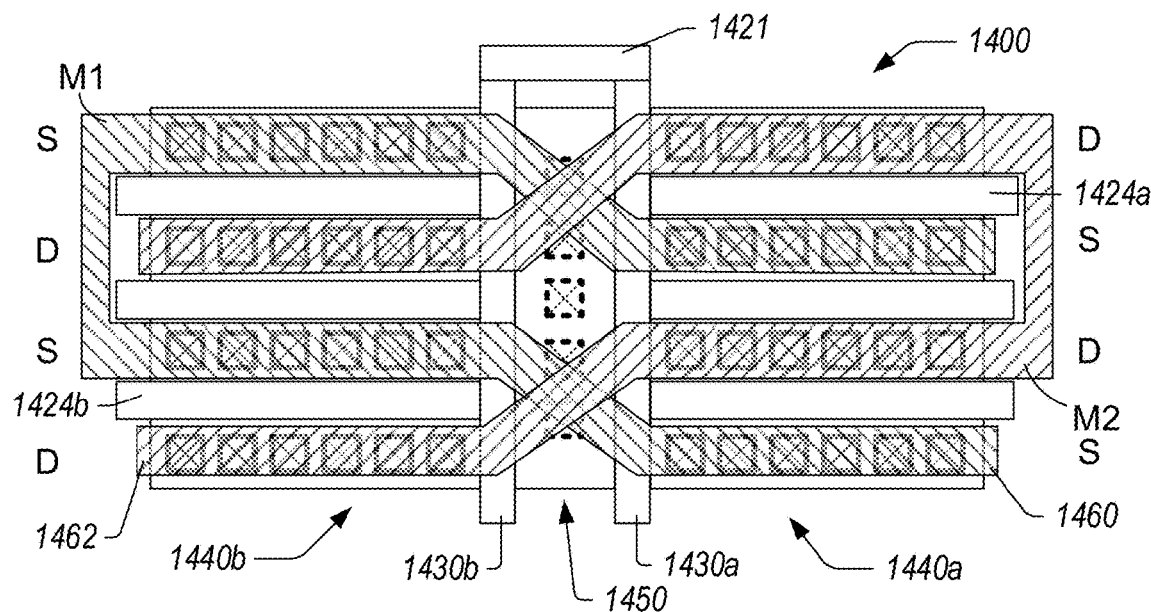
FIG. 14 illustrates an example configuration of a FET device with source and drain connections that connect offset rows in a folded T-shaped body contact configuration.

FIG. 14 illustrates a FET device 1400 having a gate configuration similar to the example of FIG. 12. The FET device 1400 can include a connecting metal 1421 configured to connect a first connecting metal 1430a to a second connecting metal 1430b to electrically connect gate fingers 1424a, 1424b on both sides of the body contact 1450. In the example of FIG. 14, however, a source connection 1460 can be made by connecting conductive features of a given strip or row in the first S/G/D assembly 1440a with conductive features of an offset strip or row in the second S/G/D assembly 1440b. For example, conductive features of the first row at the top of the second S/G/D assembly 1440b can be connected with conductive features of the second row from the top of the first S/G/D assembly 1440a. Similarly, conductive features of the third row from the top of the second S/G/D assembly 1440b can be connected with conductive features of the fourth row from the top of the first S/G/D assembly 1440a. Such two connections can be joined to form a source connection 1460 (e.g., using a first metal M1).

Similarly, conductive features of the first row at the top of the first S/G/D assembly 1440a can be connected with conductive features of the second row from the top of the second S/G/D assembly 1440b. Similarly, conductive features of the third row from the top of the first S/G/D assembly 1440a can be connected with conductive features of the fourth row from the top of the second S/G/D assembly 1440b. Such two connections can be joined to form a drain connection 1462 (e.g., using a second metal M2).

In some embodiments, a particular source finger of the first assembly 1440a can be electrically connected to a source finger of the second assembly 1440b that is positioned on a row that is offset by one row from the particular source finger of the first assembly 1440a. Similarly, a particular drain finger of the first assembly 1440a can be electrically connected to a drain finger of the second assembly 1440b that is positioned on a row that is offset by one row from the particular drain finger of the first assembly 1440a.

Figure 15:
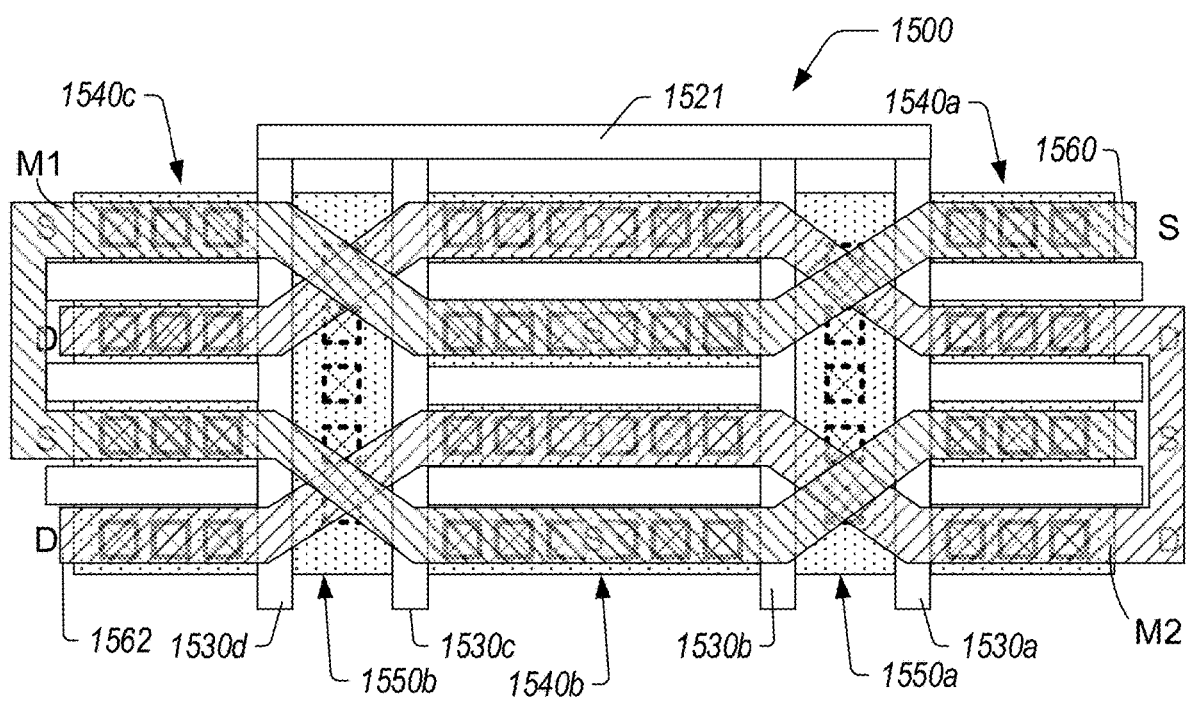
FIG. 15 illustrates an example configuration of a FET device with source and drain connections that connect offset rows in a double-folded T-shaped body contact configuration.

FIG. 15 illustrates a FET device 1500 having a gate configuration similar to the example of FIG. 13. In the example of FIG. 15, however, a source connection 1560 can be made by connecting conductive features of a given row in a S/G/D assembly with conductive features of an offset row in the neighboring S/G/D assembly. For example, conductive features of the first row at the top of the first S/G/D assembly 1540a can be connected with conductive features of the second row from the top of the second S/G/D assembly 1540b and conductive features of the first row at the top of the third S/G/D assembly 1540c. Similarly, conductive features of the third row from the top of the first S/G/D assembly 1540a can be connected with conductive features of the fourth row from the top of the second S/G/D assembly 1540b and conductive features of the third row from the top of the third S/G/D assembly 1540c. Such two connections can be joined to form a source connection 1560 (e.g., using a first metal M1).

Similarly, conductive features of the second row from the top of the first S/G/D assembly 1540a can be connected with conductive features of the first row at the top of the second S/G/D assembly 1540b and conductive features of the second row from the top of the third S/G/D assembly 1540c. Similarly, conductive features of the fourth row from the top of the first S/G/D assembly 1540a can be connected with conductive features of the third row from the top of the second S/G/D assembly 1540b and conductive features of the fourth row from the top of the third S/G/D assembly 1540c. Such two connections can be joined to form a drain connection 1562 (e.g., using a second metal M2).

In some embodiments, the offset arrangement of source and drain connections in neighboring S/G/D assemblies can provide a number of advantages. For example, impact from undesirable process variations such as source/drain mismatch and/or active region (RX)/polysilicon contact (PC) misalignment can be reduced or mitigated.

For example, suppose that in the example of FIGS. 4 and 5, the active region (RX) 412 of the FET device 400 is shifted to the left by an amount ΔW relative to the S/G/D assembly 440. In such a situation, the effective width of the S/G/D assembly 440 is then W0−ΔW.

Figure 16:
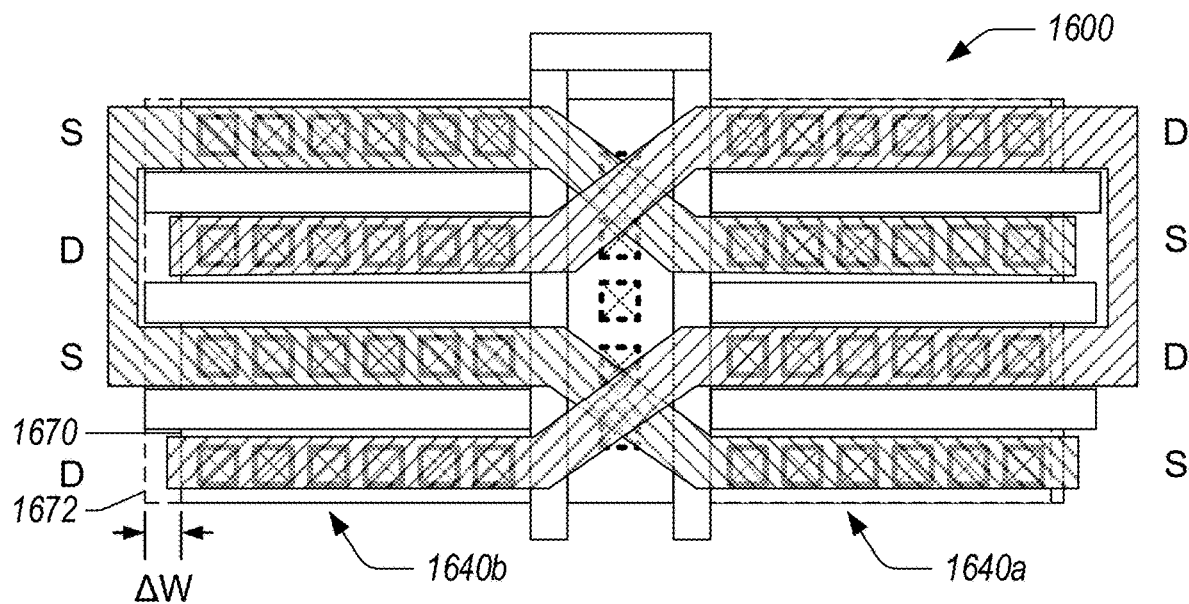
FIG. 16 illustrates an example configuration of a FET device wherein an active region has been shifted.

As illustrated in FIG. 16, suppose that a FET device 1600 configured in the same manner as the FET device 1400 in the example of FIG. 14 (which is based on the example of FIGS. 8 and 9), is shifted with the same amount of RX shift (ΔW), resulting in an original RX position 1670 and a shifted RX position 1672. In the original RX position 1670, and referring to the dimensions of FIG. 8, the total width associated with the S/G/D assemblies 1640a, 1640b is approximately W1+W1=2×W1. In the shifted RX position 1672, the width of the first S/G/D assembly 1640a is decreased by an amount ΔW, and width of the second S/G/D assembly 1640b is increased by an amount ΔW. Accordingly, the total width associated with the S/G/D assemblies 1640a, 1640b is approximately (W1−ΔW)+W1+ΔW)=2×W1. Thus, one can see that for embodiments of FET devices having an even number of S/G/D assemblies, an impact in device parameter (e.g., S/G/D width) resulting from a shift in RX can be substantially canceled or reduced.

Figure 17:
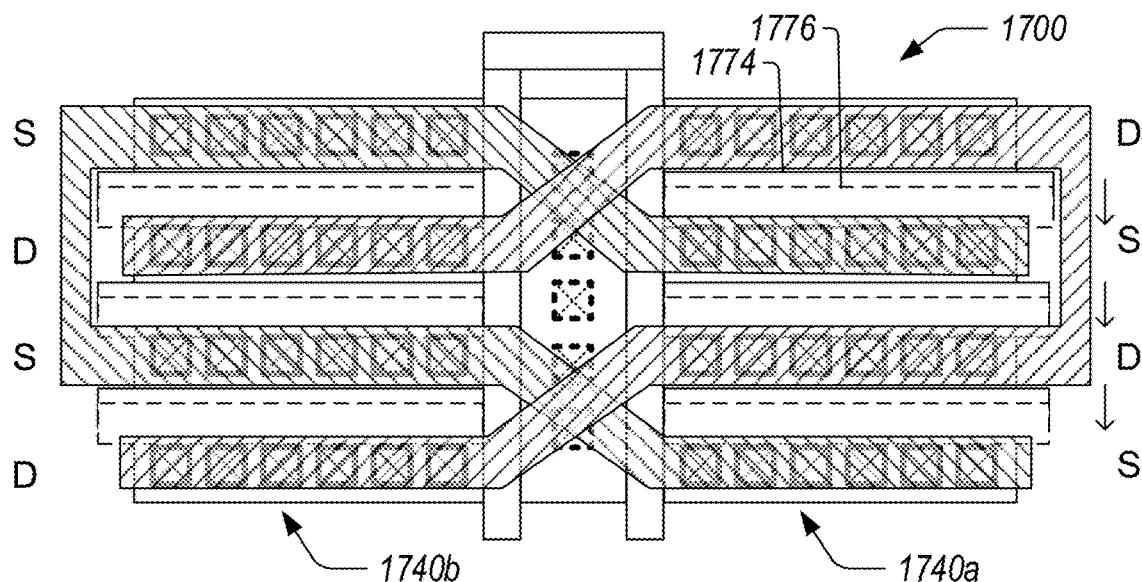
FIG. 17 illustrates an example configuration of a FET device wherein a polysilicon contact has been shifted.

In another example, and as illustrated in FIG. 17, suppose that a FET device 1700 (configured in a manner similar to the FET device 1400 described herein with reference to FIG. 14) includes a polysilicon contact (PC) that is shifted downward (as illustrated in FIG. 17) from an original PC position 1774 to a shifted PC position 1776. For the second S/G/D assembly 1740b, two rows of source contacts can be farther away from the shifted PC position 1776, while for the first S/G/D assembly 1740a, two rows of drain contacts can be farther away from the shifted PC position 1776. Accordingly, when the source and drain are connected respectively as indicated in FIG. 17, source/drain asymmetry resulting from a PC shift can be reduced.

In the various examples described herein with reference to FIGS. 8-17, it is assumed that S/G/D assemblies, as well as one or more body contacts in a given FET device are configured to form a generally symmetric FET device. It will be understood that, in some embodiments, a FET device having one or more features as described herein can be configured in non-symmetric manners with respect to one or more design parameters.

Figure 18:
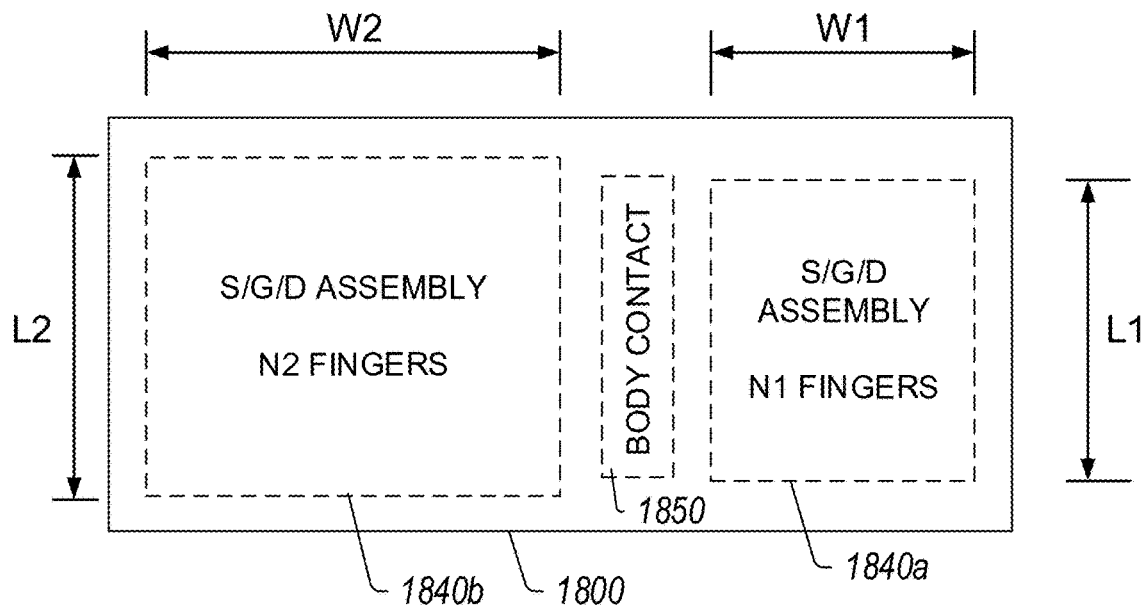
FIG. 18 illustrates a block diagram of a non-symmetric FET device wherein source, gate, drain assemblies have different design parameters.

For example, FIG. 18 illustrates a FET device 1800 having a body contact 1850 implemented between a first S/G/D assembly 1840a and a second S/G/D assembly 1840b, similar to the example FET device 800 of FIG. 8. In the example of FIG. 18, however, one or more design parameters of the FET device 1800 can be different between the first and second S/G/D assemblies 1840a, 1840b.

For example, either or both of L and W dimensions can be different among the first and second S/G/D assemblies 1840a, 1840b. In FIG. 18, the first S/G/D assembly 1840a has dimensions L1×W1, and the second S/G/D assembly 1840b has dimensions L2×W2. The values of L1 and L2 may or may not be the same. Similarly, the values of W1 and W2 may or may not be the same.

It is noted that in a configuration where the values of W1 and W2 are different, the position of the body contact 1850 is generally away from the middle.

In another example, the first and second S/G/D assemblies 1840a, 1840b can have different numbers of fingers. In FIG. 18, the first S/G/D assembly 1840a has N1 fingers, and the second S/G/D assembly 1840b has N2 fingers. The values of N1 and N2 may or may not be the same.

In the various examples described herein with reference to FIGS. 8-17, it is assumed that S/G/D assemblies, as well as one or more body contacts in a given FET device are arranged along a single direction. For example, various S/G/D assemblies and respective body contact(s) are arranged along a horizontal direction.

Figure 19:
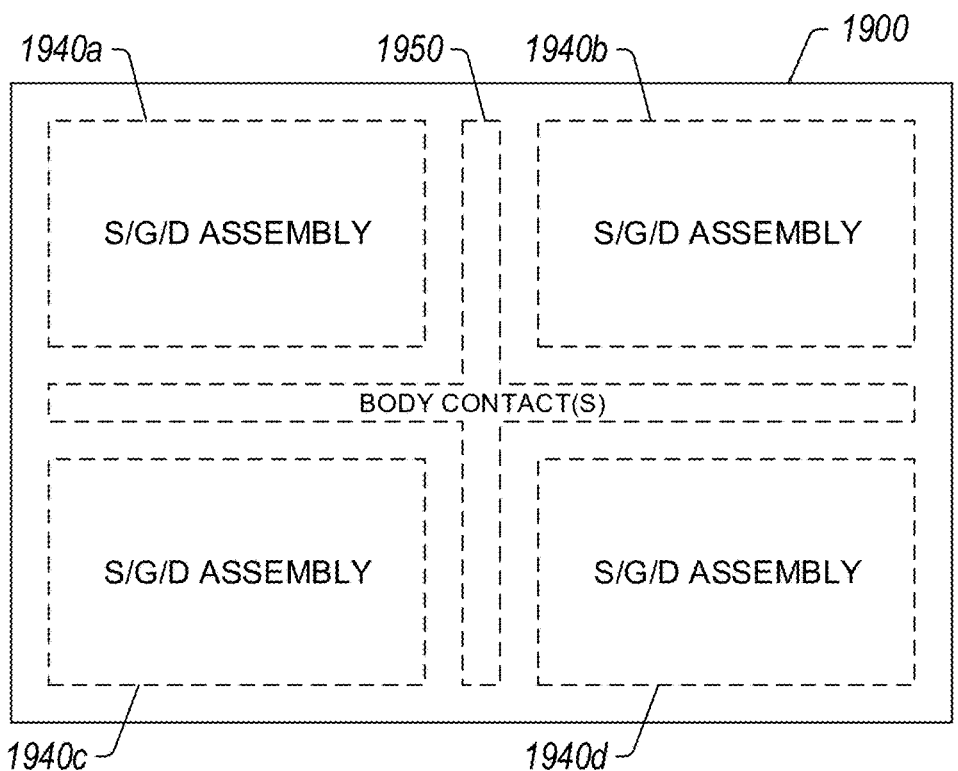
FIG. 19 illustrates a block diagram of a FET device that arranges source, gate, drain assemblies in two dimensions separated by one or more body contacts.

FIG. 19 illustrates that, in some embodiments, one or more features of the present disclosure can be implemented to provide a plurality of S/G/D assemblies arranged in two dimensions and separated by one or more body contacts. For example, four S/G/D assemblies 1940*a*, 1940*b*, 1940*c*, 1940*d* can be implemented for a FET device 1900, and such S/G/D assemblies can be separated by a cross-shaped body contact assembly indicated as 1950. It will be understood that such a body contact assembly can have one or more body contacts.

For example, the body contact assembly 1950 can include a first body contact implemented between the first and second assemblies 1940*a*, 1940*b* and a second body contact implemented between the third and fourth assemblies 1940*c*, 1940*d*. As another example, the body contact assembly 1950 can include a first body contact implemented between the first and third assemblies 1940*a*, 1940*c* and a second body contact implemented between the second and fourth assemblies 1940*b*, 1940*d*. As a further example, the body contact assembly 1950 can include a first body contact implemented between the first and second assemblies 1940*a*, 1940*b*, a second body contact implemented between the third and fourth assemblies 1940*c*, 1940*d*, a third body contact implemented between the first and third assemblies 1940*a*, 1940*c*, and a fourth body contact implemented between the second and fourth assemblies 1940*b*, 1940*d*.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined such that multiple steps and/or phases illustrated in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those illustrated and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general-purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general-purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations illustrated and described herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A method for fabricating a field-effect transistor (FET), the method comprising:
   providing a substrate;
   implementing a first assembly of source, gate, and drain on a first active region of the substrate;
   implementing a second assembly of source, gate, and drain implemented on a second active region of the substrate;
   forming a first body contact between the first assembly and the second assembly, the first body contact formed such that application of a voltage on the first body contact influences operation of the first assembly and the second assembly;
   forming a first connecting metal extending along a width of the first body contact on a first side; and
   forming a second connecting metal extending along a width of the first body contact on a second side opposite the first side.

2. The method of claim 1 wherein the substrate includes a silicon-on-insulator (SOI) substrate.

3. The method of claim 1 wherein the first assembly and the second assembly are dimensioned the same and the first body contact is positioned at the center of the FET.

4. The method of claim 1 further comprising:
   implementing a third assembly of source, gate, and drain on a third active region of the substrate; and
   forming a second body contact between the second assembly and the third assembly.

5. The method of claim 4 wherein the first assembly and the third assembly are dimensioned the same such that the first body contact and the second body contact are positioned symmetrically about a center line of the FET.

6. The method of claim 5 wherein the second assembly is dimensioned such that it has a width that is equal to the combined widths of the first assembly and the third assembly.

7. The method of claim 1 further comprising forming a finger configuration for the source, the gate, and the drain on each of the first assembly and the second assembly, each finger configuration including a plurality of fingers.

8. The method of claim 7 wherein the finger configuration of each of the first assembly and the second assembly results in source fingers and drain fingers being interleaved with the gate fingers.

9. The method of claim 8 wherein the source fingers and the drain fingers are arranged in alternating rows.

10. The method of claim 9 further comprising electrically connecting a particular source finger of the first assembly to a source finger of the second assembly that is positioned on the same row as the particular source finger of the first assembly.

11. The method of claim 10 further comprising electrically connecting a particular drain finger of the first assembly to a drain finger of the second assembly that is positioned on the same row as the particular drain finger of the first assembly.

12. The method of claim 9 further comprising electrically connecting a particular source finger of the first assembly to a source finger of the second assembly that is offset by one row from the particular source finger of the first assembly.

13. The method of claim 12 further comprising electrically connecting a particular drain finger of the first assembly to a drain finger of the second assembly that is offset by one row from the particular drain finger of the first assembly.

14. The method of claim 1 further comprising:
   implementing a first plurality of gate fingers;
   electrically coupling the first plurality of gate fingers to the first connecting metal that extends away from the first connecting metal over the first active region;
   implementing a second plurality of gate fingers; and
   electrically coupling the second plurality of gate fingers to the second connecting metal that extends away from the second connecting metal over the second active region.

15. The method of claim 14 further comprising forming a third connecting metal that electrically couples the first connecting metal and the second connecting metal to electrically connect the first plurality of gate fingers and the second plurality of gate fingers.

16. A method for fabricating a radio-frequency (RF) device, the method comprising:
   forming a field-effect transistor (FET) over a substrate layer, the FET including a first assembly of source, gate, and drain on a first active region of the substrate layer, the FET also including a second assembly of source, gate, and drain implemented on a second active region of the substrate layer, the FET also including a first body contact implemented between the first assembly and the second assembly, the first body contact formed such that application of a voltage on the first body contact influences operation of the first assembly and the second assembly, the FET also including a first connecting metal extending along a width of the first body contact on a first side, the FET also including a second connecting metal extending along a width of the first body contact on a second side opposite the first side;

electrically connecting the substrate layer to a substrate node; and coupling a non-grounding circuit to the substrate node to adjust RF performance of the FET.

17. The method of claim 16 wherein the RF device is a switch.

18. The method of claim 16 wherein the FET further includes a finger configuration for the source, the gate, and the drain on each of the first assembly and the second assembly, each finger configuration including a plurality of fingers.

19. The method of claim 18 wherein the finger configuration of each of the first assembly and the second assembly results in source fingers and drain fingers being interleaved with the gate fingers.

20. A method for fabricating a field-effect transistor (FET), the method comprising:

providing a substrate;

implementing a first assembly of source, gate, and drain on a first active region of the substrate;

implementing a second assembly of source, gate, and drain implemented on a second active region of the substrate;

forming a first body contact between the first assembly and the second assembly, the first body contact formed such that application of a voltage on the first body contact influences operation of the first assembly and the second assembly;

implementing a third assembly of source, gate, and drain on a third active region of the substrate, the second assembly dimensioned such that it has a width that is equal to the combined widths of the first assembly and the third assembly; and forming a second body contact between the second assembly and the third assembly, the first assembly and the third assembly being dimensioned the same such that the first body contact and the second body contact are positioned symmetrically about a center line of the FET.

* * * * *